United States Patent
Gunawan (10) Patent No.: US 9,103,653 B2
(45) Date of Patent: *Aug. 11, 2015

(54) NON-CONTACT SHEET CONDUCTIVITY MEASUREMENTS IMPLEMENTING A ROTATING MAGNETIC BRAKING SYSTEM

(75) Inventor: Oki Gunawan, Fair Lawn, NJ (US)

(73) Assignee: International Business Machines Corporation, Armonk, NY (US)

(*) Notice: Subject to any disclaimer, the term of this patent is extended or adjusted under 35 U.S.C. 154(b) by 417 days.

This patent is subject to a terminal disclaimer.

(21) Appl. No.: 13/533,187

(22) Filed: Jun. 26, 2012

(65) Prior Publication Data

US 2013/0346003 A1    Dec. 26, 2013

Related U.S. Application Data

(63) Continuation of application No. 13/529,097, filed on Jun. 21, 2012.

(51) Int. Cl.
  *G01N 27/02* (2006.01)
  *G01B 7/06* (2006.01)
  *G01R 27/00* (2006.01)
  *G01B 7/02* (2006.01)

(52) U.S. Cl.
  CPC .............. *G01B 7/087* (2013.01); *G01B 7/023* (2013.01); *G01R 27/00* (2013.01)

(58) Field of Classification Search
  CPC ..... G01N 27/023; G01N 27/02; G01B 7/087; G01R 27/00
  USPC ................................. 324/224, 207.11; 702/65
  See application file for complete search history.

(56) References Cited

U.S. PATENT DOCUMENTS

| | | | |
|---|---|---|---|
| 2,460,095 A | 1/1949 | Love | |
| 3,992,938 A * | 11/1976 | Miller | ............................. 73/163 |
| 4,477,755 A | 10/1984 | Rickert | |
| 6,040,694 A | 3/2000 | Becker | |
| 6,072,313 A | 6/2000 | Li et al. | |
| 6,407,546 B1 | 6/2002 | Le et al. | |
| 6,462,538 B2 | 10/2002 | Harada | |
| 6,819,120 B2 | 11/2004 | Tam | |
| 6,879,167 B2 | 4/2005 | Ju et al. | |
| 2001/0004210 A1 * | 6/2001 | Harada | ......................... 324/224 |

(Continued)

OTHER PUBLICATIONS

N. R. Dilley et al., "Measurement of Electrical Resistivity Without Contacts Using the ACMS Option," Quantum Design, Application Note 1084-306, Rev. B01, Dec. 2009, 8 pages.

(Continued)

*Primary Examiner* — Arleen M Vazquez
*Assistant Examiner* — Brent J Andrews
(74) *Attorney, Agent, or Firm* — Cantor Colburn LLP; Vazken Alexanian (57) ABSTRACT

A method for calculating sheet conductivity with an absolute working distance measurement includes selecting a motor frequency $f_M$ for a motor having a first magnet disposed on a shaft, tuning a motor voltage $V_M$ for the motor, measuring a no-load power of the motor, inserting a material adjacent the first magnet, tuning the motor frequency to $f_M$, measuring the on-load power of the motor, measuring the absolute working distance and calculating the sheet conductivity of the material.

9 Claims, 9 Drawing Sheets

(56) References Cited

U.S. PATENT DOCUMENTS

2006/0164091 A1     7/2006    Nestleroth et al.
2007/0159293 A1*   7/2007    Landsberger et al. ...... 338/22 R
2009/0267594 A1    10/2009   Kather et al.

OTHER PUBLICATIONS

Y. Ju et al., "Contactless measurement of electrical conductivity of semiconductor wafers using the reflection of millimeter waves," Appl. Phys. Lett., vol. 81, 2002, pp. 3585-3587.

Y. Kraftmakher, "Eddy currents: Contactless measurement of electrical resistivity," Am. J. Phys., vol. 68, Apr. 2000, pp. 375-379.

Y. Levin et al., "Electromagnetic braking: A simple quantitative model," Am. J. Phys., vol. 74, Sep. 2006, pp. 815-817.

X. Ma et al., "Measurement of the electrical conductivity of open-celled aluminium foam using non-contact eddy current techniques," NDT & E International, vol. 38, Issue 5, Jul. 2005, pp. 359-367.

D. J. Griffiths, "Introduction to electrodynamics", 3rd Ed, Prentice Hall, 1999, p. 246 only.

J. R. Reitz, "Force on moving magnets due to eddy currents," J. Appl. Phys., vol. 41, No. 5, Apr. 1970, pp. 2067-2071.

W. R. Smythe, "Static and Dynamic Electricity," 3rd Ed, McGraw Hill Book Company, 1968, pp. 382-391 only.

\* cited by examiner

NON-CONTACT SHEET CONDUCTIVITY MEASUREMENTS IMPLEMENTING A ROTATING MAGNETIC BRAKING SYSTEM

CROSS REFERENCE TO RELATED APPLICATIONS

This application is a continuation of U.S. patent application Ser. No. 13/529,097 filed Jun. 21, 2012, the contents of which are incorporated herein by reference thereto.

BACKGROUND

The present invention relates to semiconductor device testing, and more specifically, to systems, methods and computer program products for making sheet conductivity measurements.

Electrical conductivity (or resistivity) and thickness measurement of materials is a common and critical measurement in many applications such as, for example, manufacturing, metallurgy and semiconductor industries. If the material under test is a thin conductor or thin film, sheet conductivity ($\sigma_S$), which is the product of conductivity $\sigma$ and thickness t: $\sigma_S = \sigma \times t$, is often measured. Thus, for a material with known conductivity the sheet conductivity measurement could also yield the thickness, which is also an important metrology activity in many applications.

The sheet conductivity (or sheet resistivity) can be measured by simple resistance measurements, implementing electrical contacts, which require good Ohmic connections at the contacts. Achieving good contacts can be difficult due to the presence of insulating layer covering the material under test.

SUMMARY

Exemplary embodiments include a method for calculating sheet conductivity with an absolute working distance measurement, the method including selecting a motor frequency $f_M$ for a motor having a first magnet disposed on a shaft, tuning a motor voltage $V_M$ for the motor, measuring a no-load power of the motor, inserting a material adjacent the first magnet, tuning the motor frequency to $f_M$, measuring the on-load power of the motor, measuring the absolute working distance and calculating the sheet conductivity of the material.

Additional exemplary embodiments include a method for calculating sheet conductivity without an absolute working distance measurement, the method including selecting a motor frequency $f_M$ for a motor having a first magnet disposed on a shaft, tuning a motor voltage $V_M$ for the motor, measuring a no-load power of the motor, inserting a material adjacent the first magnet, recording an arbitrary distance d', stepping the arbitrary distance d' by $\Delta d$ a predetermined number of times, for each stepped distance $\Delta d$ tuning the motor frequency to $f_M$, measuring the on-load power of the motor, and calculating the sheet conductivity of the material.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

In exemplary embodiments, the systems and methods described herein implement non-contact sheet conductivity measurement utilizing magnetic braking effects that occurs between moving magnets and an electrically conducting material. In exemplary embodiments, for example, a rotating disc with magnet(s) attached or a rotating spherical magnet, driven by a direct current (DC) motor, placed in a close proximity to the conductor, is implemented. The magnetic braking effect due to the induced eddy current in the material creates a retarding torque to the rotating magnet and increases the power consumed by the motor. By measuring this extra power, the sheet conductivity of the material can be determined. The extra power measurement may be performed either with or without a distance measurement between the magnet and the conductor. The latter approach eliminates the extra need of distance measurement thus allowing a simpler non-contact metrology system for many applications. Furthermore, for the case of a thick conductor, the conductivity, thickness and the initial magnet-conductor distance can be determined separately, thus making it a multi-purpose metrology system. In addition, the systems and methods described herein can also measure the thickness of the conductor under test if the conductivity is known.

Figure 1A:
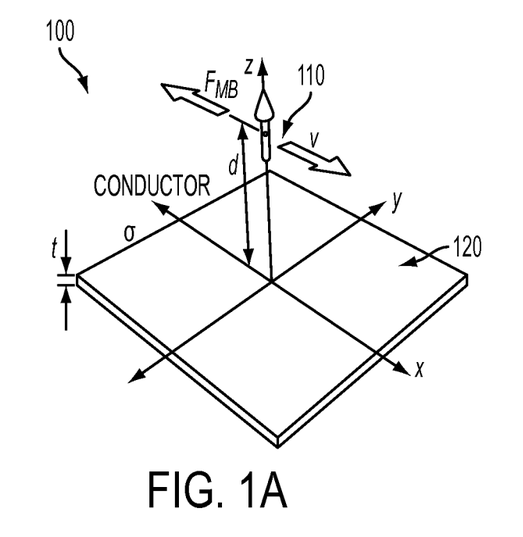
FIG. 1A diagrammatically illustrates a spatial configuration that illustrates a basic mechanism of the magnetic braking effect of a magnetic dipole in a linear motion.
Figure 1B:
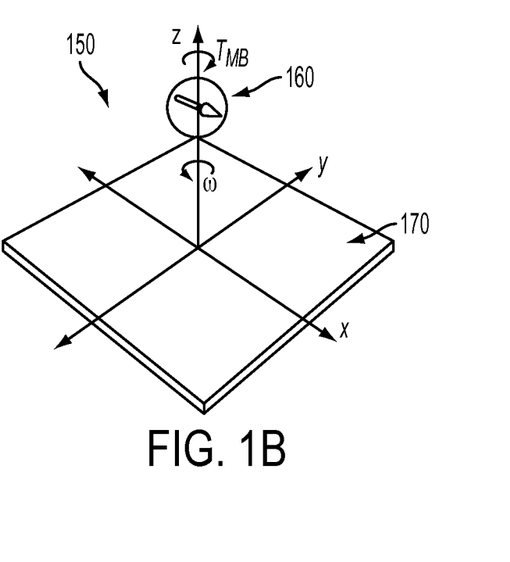
FIG. 1B diagrammatically illustrates a spatial configuration that illustrates a basic mechanism of the magnetic braking effect of a magnetic dipole in a rotational motion.

FIG. 1A diagrammatically illustrates a spatial configuration 100 that illustrates a basic mechanism of the magnetic braking effect of a magnetic dipole in a linear motion. FIG. 1B diagrammatically illustrates a spatial configuration 150 that illustrates a basic mechanism of the magnetic braking effect of a magnetic dipole in a rotational motion. It will be appreciated that the dipoles 110, 160 correspond to an associated magnet, which is not shown for illustrative purposes. The braking forces and torque oppose the motion of the magnets.

When a magnetic dipole 110, 160 moves along a conductor plane 120, 170 the magnetic dipole 110, 160 induces eddy current in the conductor plane 120, 170 due to Faraday's effect. This eddy current interacts with the magnetic field from the dipole 110, 160 (associated with a magnet) and produces Lorentz's force onto the conductor plane 120, 170 accompanied by an opposite reaction force on the magnetic dipole 110, 160 according to the Newton's third law. The latter force is the magnetic braking or drag force, also known as eddy current force. FIGS. 1A and 1B consider two elementary cases of a magnetic dipole motion: linear and rotational.

For a linear motion of FIG. 1A, where a magnetic dipole moves a long a thin conductor sheet, the magnetic braking force on the magnet is given as:

$$F_{MB} = -\alpha \sigma_S \frac{v}{d^4} \quad (1)$$

where $\alpha = 3\mu_0^2 m^2/64\pi$, with $\sigma_S$ being the sheet conductivity: $\sigma_S = \sigma \times t$, $\mu_0$ is the magnetic permittivity in vacuum (in most non-ferromagnetic metals $\mu = \mu_0$), m is the magnetic moment of the magnetic dipole, v is the velocity and d is the distance between the magnet and the conductor. The minus sign indicates the magnetic braking force $F_{MB}$ is opposite to the velocity.

Similarly, if the magnetic dipole with a horizontal orientation rotates at a fixed position above a sheet of conductor as shown in FIG. 1B, there will be a braking torque given as:

$$T_{MB} = -\beta \sigma_S \frac{\omega}{d^2} \quad (2)$$

where $$\beta = \mu_0^2 m^2 / 64\pi.$$

Both equations 1 and 2 are valid for: (1) a thin conducting material where t<<d, which condition applies to most semiconductor thin film situations where the thickness is on the order of microns, (2) a large area conductor sheet where the size of the conductor is larger than the magnet assembly, and (3) a low speed condition, where v<<$v_0$ for the linear case and $\omega$<<$v_0$/d for the rotational case. In addition, $v_0 = 2/\mu_0 \sigma t$ is the "characteristic eddy current speed" of the conductor. This condition implies that the induced secondary magnetic field due to the eddy current is negligible; and (4) a quasi-static condition, where the magnetic fields from the magnet associated with the dipole permeates the whole body of the conducting material. In this condition, the effect of changing electric field or the Maxwell displacement term (−∂E/∂t where E is the electric field) is negligible. In contrast, when the velocity is very high (v>>$v_0$), there is a skin-effect where the magnetic fields are concentrated on the surface because the magnetic field produced by the eddy current cancel the magnetic field inside the material.

The low speed condition and quasi-static condition apply for most thin film measurements. For example, for a typical metal, $\sigma \sim 10^7$ S/m and conductor thickness t=1 mm: $v_0$=159 m/s, which is a very high speed. For a semiconductor thin film with a typical thickness on the order of microns, $v_0$ is even higher.

Figure 2A:
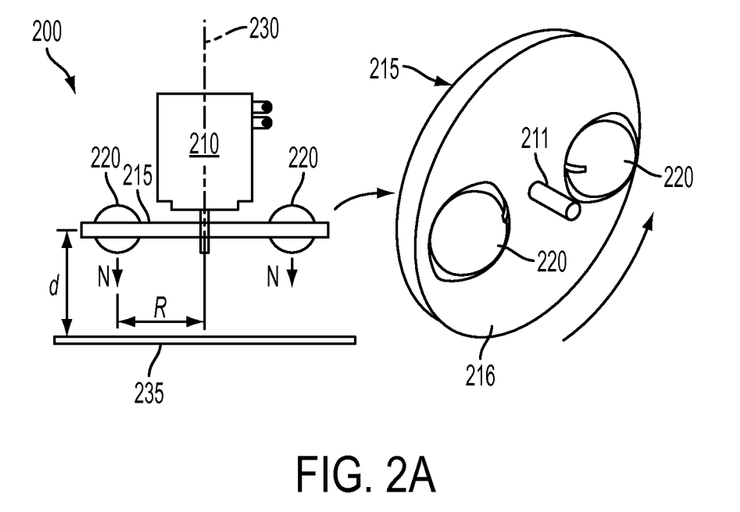
FIG. 2A illustrates an exemplary magnetic head apparatus.
Figure 2B:
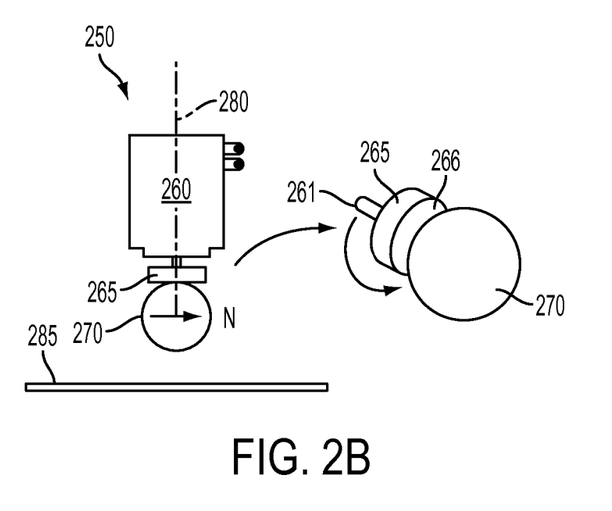
FIG. 2B illustrates another exemplary magnetic head apparatus.

FIG. 2A illustrates an exemplary magnetic head apparatus 200. The apparatus 200 includes a motor 210 (e.g., a DC motor) rotationally coupled to a rotating disk 215 via a shaft 211 having an axis of rotation 230. In the example illustrated, two magnetic spheres 220 are embedded in a bottom surface 216 of the rotating disk 215 adjacent the shaft 211. It will be appreciated that two or more magnetic spheres can be implemented. In the example of FIG. 2A, the magnetic spheres 220 are offset by a distance R from the shaft 211, and thus rotate about the axis of rotation 230. The apparatus 200 is displaced a distance, d, from a conductor 235. For illustrative purposes, the apparatus 200 is referred to herein as a Type A magnetic head. FIG. 2B illustrates an exemplary magnetic head apparatus 250. The apparatus 250 includes a motor 260 (e.g., a DC motor) rotationally coupled to a rotating disk 265 via a shaft 261. In the example illustrated, a magnetic sphere 270 is embedded in a bottom surface 266 of the rotating disk 265 at a location at the shaft 211, such that the magnetic sphere 270 rotates about a common axis of rotation 280 with the shaft 261. The apparatus 250 is displaced a distance from a conductor 285. For illustrative purposes, the apparatus 250 is referred to herein as a Type B magnetic head. The Type A and Type B magnetic heads are described based on the linear and rotational type of the magnetic braking effect.

In both FIGS. 2A and 2B, as the motor 210, 260 rotates, it experiences a magnetic braking torque that produces power dissipation: $P_{MB} = F_{MB} R\omega$ for the Type A magnetic head, and $P_{MB} = T_{MB} \omega$ for Type B magnetic head. The angular velocity $\omega$ can be obtained by measuring the motor rotation frequency $f_M$ using a digital Hall or optical sensor (see FIG. 4 herein) in accordance with the expression: $\omega = 2\pi f_M$.

For the Type A magnetic head:

$$P_{MB} = \frac{N\alpha\sigma_S R^2 \omega^2}{d^4} = \frac{4N\alpha\sigma_S R^2 \pi^2 f_M^2}{d^4} \quad (3)$$

where $f_M$ is the motor rotation frequency, N is the number of magnets and R is the radial position of the magnet.

For the Type B magnetic head:

$$P_{MB} = \frac{\beta\sigma_S \omega^2}{d^2} = \frac{4\beta\sigma_S \pi^2 f_M^2}{d^2} \quad (4)$$

The magnetic braking power dissipation $P_{MB}$ can be obtained from the differential power measurements of the motor 210 or 260 before and after the conductor 235 or 285 is inserted. In a DC motor, the motor kinetic power $P_K$ is given as the total electric power ($I_M V_M$) minus the power dissipated by the internal series resistance $R_M$ of the motor ($I_M^2 R_M$):

$$P_K = I_M V_M - I_M^2 R_M \quad (5)$$

The motor internal series resistance $R_M$ originates mainly from the coil resistance and the contact between the stator and the rotor of the motor. $R_M$ can be measured as the resistance when the motor is not moving and thus has no back electromotive (emf) potential due to motor rotation.

Figure 3A:
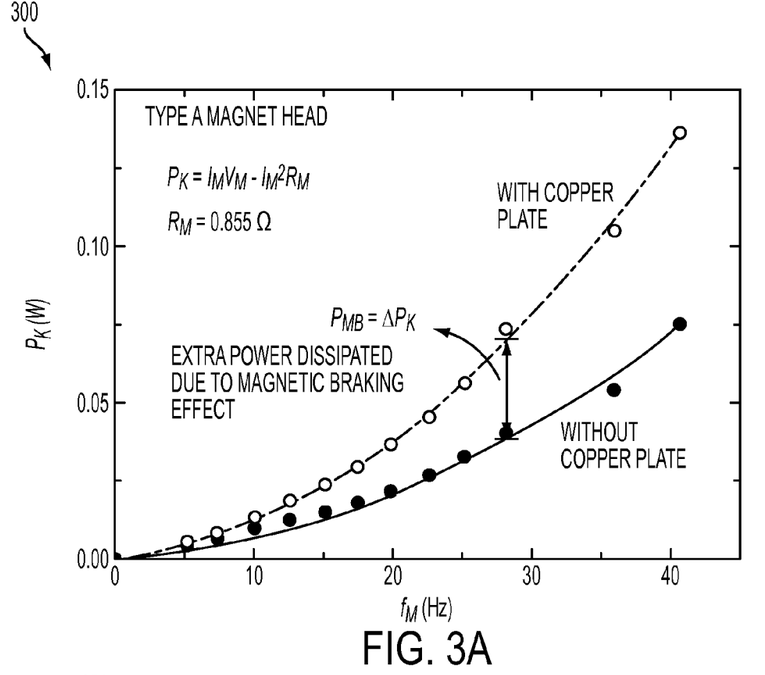
FIG. 3A illustrates a plot of the motor kinetic power versus motor frequency.
Figure 3B:
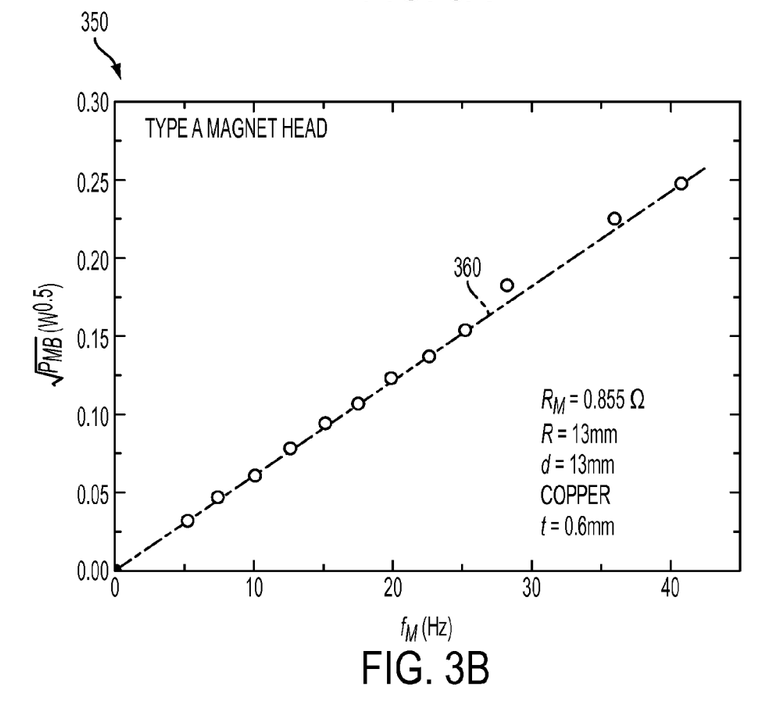
FIG. 3B illustrates a plot of the square root of the magnetic braking power $\sqrt{P_{MB}}$ versus motor frequency.

FIGS. 3A and 3B illustrate plots 300, 350 of power versus frequency for Type A magnet head as an example. FIG. 3A illustrates experimental data for the rotating magnetic apparatus 200, showing that the Type A magnetic head requires more kinetic power to rotate at the same frequency if the conductor 235 (e.g., a copper sheet) is inserted underneath. FIG. 3B illustrates $\sqrt{P_{MB}}$ vs. motor frequency $f_M$. The plot 350 demonstrates good linearity consistent with Eq. 3. The slope 360 yields the sheet conductivity of the conductor 235.

As such, with the Type A magnetic head, with the conductor 235 under the rotating magnets 220, the magnetic braking torque increases the kinetic power ($P_K$) of the motor 210 as shown in FIG. 3A. The magnetic braking power $P_{MB}$ can be obtained from the difference between the kinetic power under load condition ($P_K'$) and the power under no-load condition ($P_K$) at constant rotation frequency:

$$P_{MB} = P_K' - P_K \qquad (6)$$

An example of experimental data of $P_{MB}^{-0.5}$ versus motor frequency $f_M$ for a Type A magnetic head is given in FIG. 3B, in agreement with Eq. 3.

Referring again to FIG. 2A, the magnetic spheres 220 are radially arranged on the rotating disk 215. The dipole orientation or magnetization is vertical (downward or upward). In exemplary embodiments, the Type A magnetic head has greater measurement sensitivity since the magnetic spheres 220 can be placed away from the center of the rotating disk 215 (i.e., increasing distance, R), thus gaining higher radial velocity. However the detection footprint is larger in the arrangement. The sensitivity can also be improved by using more than two magnets (N>2). An arrangement with more than two magnets, allows simple speed detection scheme using a Hall sensor mounted in the proximity to the magnet (see FIG. 4 herein). One potential disadvantage is that the sensitivity falls off quickly with distance as $P_{MB} \sim 1/d^4$ (Eq. 3). However, this disadvantage can be alleviated by putting magnets at larger distance (radius), R.

Referring again to FIG. 2B, the magnetic sphere 270 is centered at the axis of rotation 280 with horizontal magnetization. The Type B magnetic head can have a very small footprint or higher spatial resolution limited only by the size of the magnet. As such, the apparatus 250 could detect local conductivity of a small area. Another advantage is that the apparatus 250 is less sensitive to the distance as $P_{MB} \sim 1/d^2$ (see Eq. 4). However, the disadvantage is that the angular speed detection is more demanding requiring additional setup such as optical based tachometer (rotation speed sensor).

The exemplary embodiments herein use spherical magnets because they produce a magnetic field that follows pure magnetic point dipole behavior. As such, the distance dependence behaviors in Eq. 1 and 2 are valid even at very close distance, which is relevant to increase the sensitivity of the measurement where the braking force or torque is larger. It is appreciated that non-spherical magnets, such as cube or disc-shaped for example, are also contemplated in other exemplary embodiments. However Eq. 1 and 2 are only valid at a far distance: $d \gg s$ where s is the size of the magnet. Furthermore, the force and torque become very weak.

Figure 4:
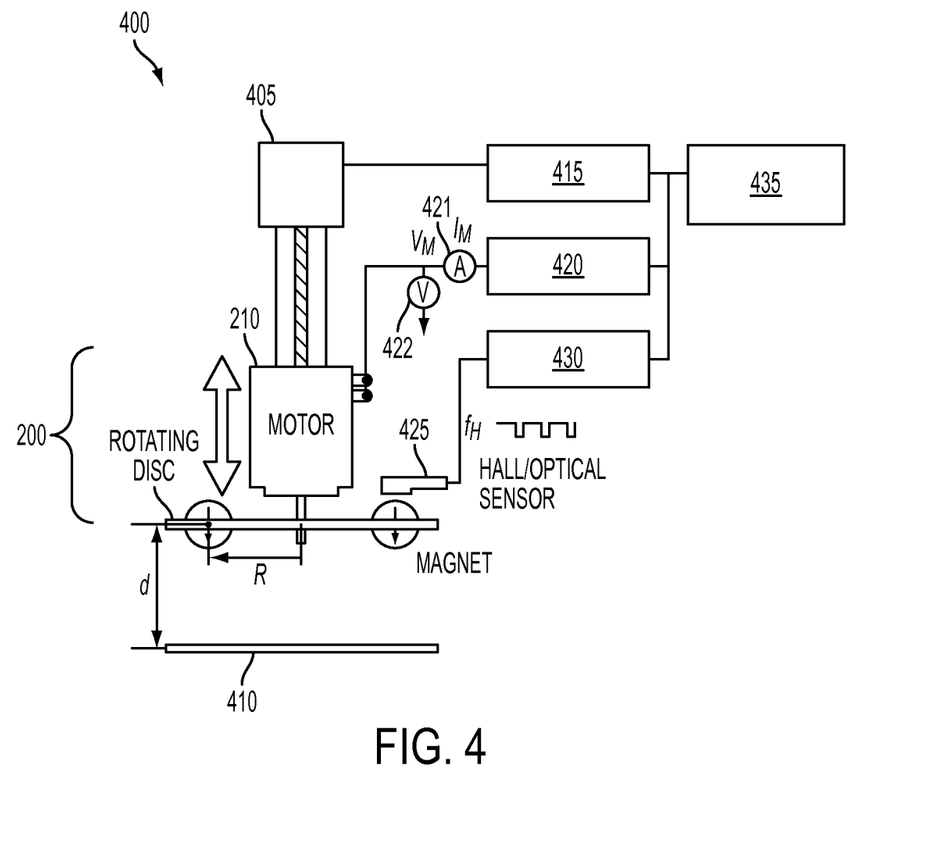
FIG. 4 illustrates an exemplary non-contact sheet conductivity measurement system.

FIG. 4 illustrates an exemplary non-contact sheet conductivity measurement system 400. For illustrative purposes, the Type A magnetic head (apparatus 200 of FIG. 2A) is shown. It is understood that the system 400 can be interchanged with the Type B magnetic head (apparatus 250 of FIG. 2B). In exemplary embodiments, the system 400 includes the apparatus 200 (or 250). The motor 210 (or 260) is coupled to a linear actuator 405 (e.g., a z-axis linear actuator) that moves the motor 210 towards and away from a material under test 410, thereby varying the distance, d. The linear actuator 405 is communicatively coupled to a motor controller 415 (e.g., a stepper motor z-axis controller) to provide instructions for moving the motor 210. The motor 210 is coupled to a power supply 420 for configured to provide power to the motor 210. The system 400 further includes an ammeter 421 and a voltmeter 422 for respectively measuring the electric current $I_M$ and voltage $V_M$ for the magnetic braking power dissipation values described herein, such as in Eqs. (3) and (4). The system 400 further includes a Hall sensor 425 positioned adjacent the spherical magnets 220 (or 270). As described herein, the Hall sensor 425 can measure the motor rotation frequency $f_M$. The Hall sensor 425 is communicatively coupled to a frequency meter 430 for measuring $f_M$ from the Hall sensor 425. In other exemplary embodiments, other types of detectors such as, but not limited to, optical detectors can be implemented to measure the motor rotation frequency $f_M$. The system 400 further includes a suitable computing system 435 communicatively coupled to the motor controller 415, the power supply 420, the ammeter 421, the voltmeter 422 and the frequency meter 430 in order to store and process the various parameters described herein. In addition, the computing system 435 can further implement instructions for non-contact sheet conductivity measurement methods as now described.

For illustrative purposes, two sheet conductivity measurement methods are described herein. For further illustrative purposes, the Type A magnetic head is described. It will be appreciated that the methods described herein also apply to the Type B magnetic head by applying the appropriate Type B magnetic head equations (e.g., Eq. 4). The first non-contact sheet conductivity measurement method is with absolute working distance measurement. The second non-contact sheet conductivity measurement method is without absolute working distance measurement.

Regardless of either method, the internal series resistance of the motor, $R_M$ is first measured. The internal series resistance measurement can be done by simple measurement of motor resistance when it is stationary and does not have to be performed in every measurement. For motor operation, the rotating frequency is selected reasonably low (e.g., <200 Hz), so that it does not induce resonance with the whole system 400 that causes extra mechanical power loss.

Figure 5:
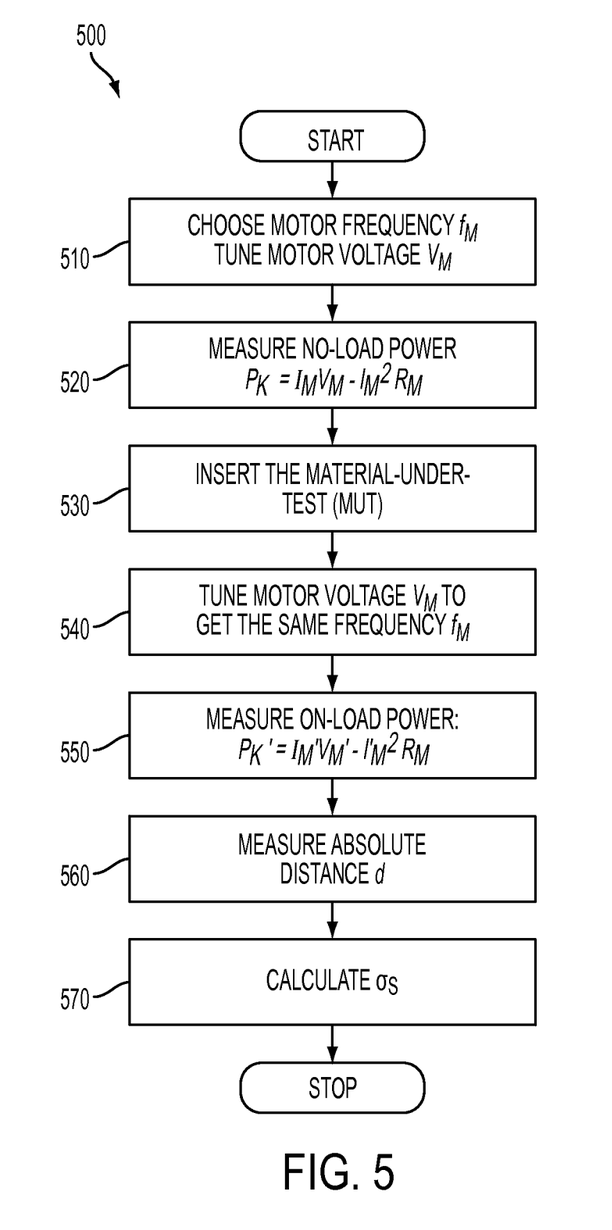
FIG. 5 illustrates a flow chart for a method for calculating sheet conductivity with an absolute working distance measurement in accordance with exemplary embodiments.

FIG. 5 illustrates a flow chart for a method 500 for calculating sheet conductivity with an absolute working distance measurement in accordance with exemplary embodiments. In exemplary embodiments, the absolute working distance (d) is measured to calculate the sheet conductivity. The system 400 is calibrated first to obtain the coefficient α using Eq. 3 (or Eq. 4 for the Type B magnetic head) by performing measurements on a reference material with known thickness and conductivity. The calibration procedure is the same with actual measurements described herein, for the exception that Eq. 3 (or Eq. 4) is solved for the coefficient α instead of the sheet conductivity $\sigma_S$. At block 510, the user selects the motor frequency $f_M$, and tunes the motor voltage $V_M$. The motor frequency can be set and measured implementing the motor controller 415 and frequency meter 430 as described herein. At block 520, the user measures the no-load power as given in Eq. (5). The ammeter 421 and the voltmeter 422 are used for the measuring the respective values, $I_M$ and $V_M$ All measurements can be made and stored implementing the computing system 435 as described herein. At block 530, the user can then insert the material under test (e.g., the material under test 410 in FIG. 4). As described herein, the motor 210 (260) will experience a braking torque. As such, at block 540, the user tunes the motor voltage $V_M$ to obtain the same $f_M$. The motor frequency can be set and measured implementing the motor controller 415 and frequency meter 430 as described herein. At block 550, the user then measures the on-load power as given in Eq. (5). The ammeter 421 and the voltmeter 422 are used for the measuring the respective values, $I_M$ and $V_M$ All measurements can be made and stored implementing the computing system 435 as described herein. At block 560, the user then measures the absolute distance d. It can be appreciated that the user implements an external measuring device to measure the absolute distance d, such as an optical sensor or direct distance measurement system like contact caliper, which can then be input and stored in the computing system 435. At block 570, the user then calculates $\sigma_S$ from Eq. 3 (or Eq. 4) as described herein. It can be appreciated that the computing system 435 is implementing in calculating $\sigma_S$. As such, after the measurements the sheet conductance can be calculated using:

$$\sigma_S = \frac{P_{MB} d^4}{4N\alpha R^2 \pi^2 f_M^2} \qquad (7)$$

where the magnetic braking power $P_{MB}$ is given in Eq. 6.

Figure 6:
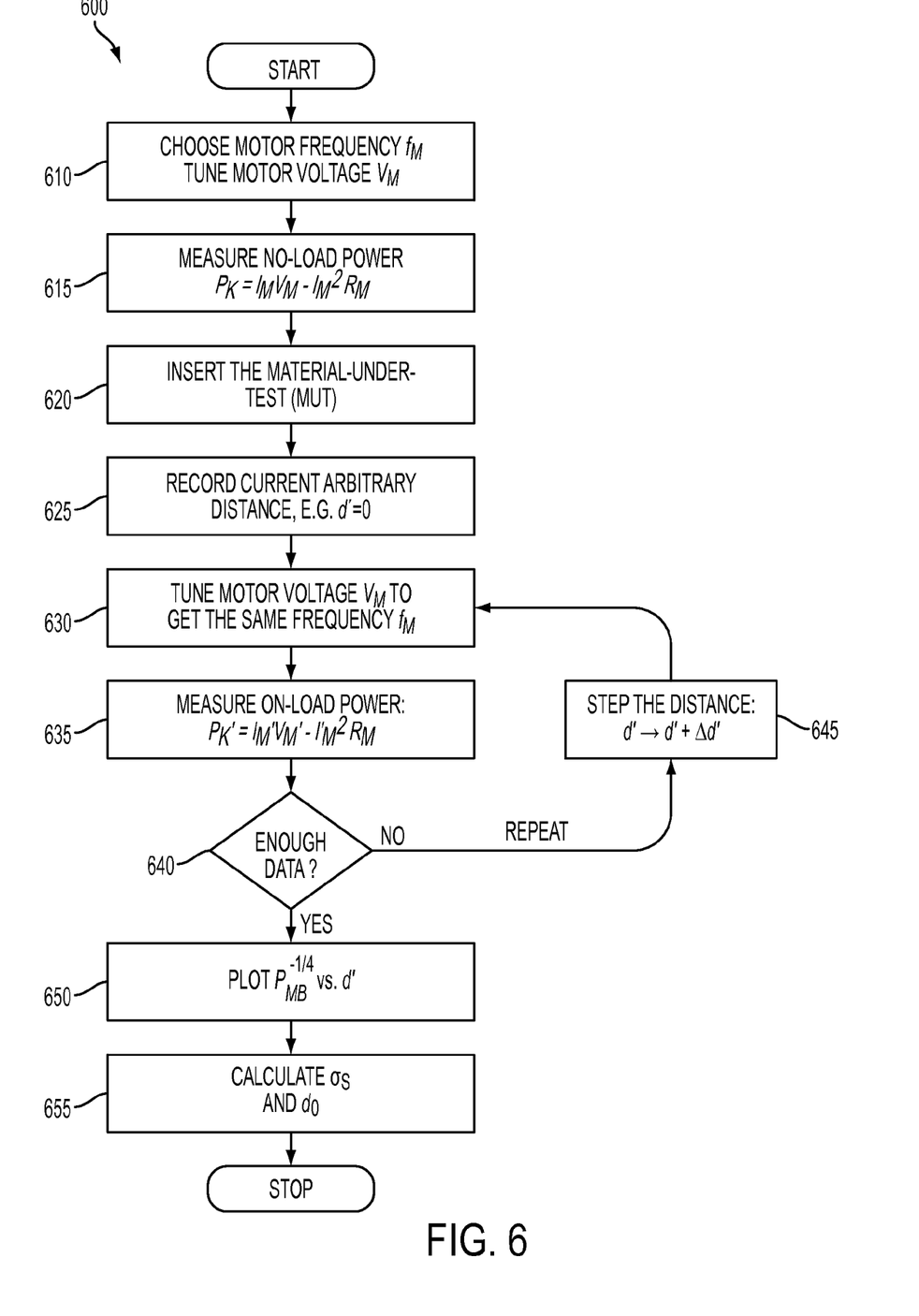
FIG. 6 illustrates a flow chart for a method for calculating sheet conductivity without absolute working distance measurement in accordance with exemplary embodiments.

FIG. 6 illustrates a flow chart for a method 600 for calculating sheet conductivity without absolute working distance measurement in accordance with exemplary embodiments. As described with respect to the method 500 in FIG. 5, measurement of the absolute working distance d includes employment of an extra apparatus such as optical sensor or direct distance measurement system like contact caliper. In exemplary embodiments, the sheet conductivity measurement can be made without the need to measure the actual working distance d.

The system 400 is calibrated first to obtain the coefficient $\alpha$ using Eq. 3 (or Eq. 4 for the Type B magnetic head) by performing measurements on a reference material with known thickness and conductivity. The calibration procedure is the same with actual measurements described herein, for the exception that Eq. 3 (or Eq. 4) is solved for the coefficient $\alpha$ instead of the sheet conductivity $\sigma_S$. At block 610, the user selects the motor frequency $f_M$, and tunes the motor voltage $V_M$. The motor frequency can be set and measured implementing the motor controller 415 and frequency meter 430 as described herein. At block 615, the user measures the no-load power as given in Eq. (5). The ammeter 421 and the voltmeter 422 are used for the measuring the respective values, $I_M$ and $V_M$. All measurements can be made and stored implementing the computing system 435 as described herein. At block 620, the user can then insert the material under test (e.g., the material under test 410 in FIG. 4). At block 625, the user measures a current arbitrary distance, such as d=0. In exemplary embodiments, the absolute distance measurement is avoided by linearizing the distance dependence in Eq. 3 by applying power $-\tfrac{1}{4}$ to both sides of the equation giving:

$$P_{MB}^{-1/4} = (4N\alpha\sigma_S R^2 \pi^2 f_D^2)^{-1/4} d = B(d' + d_0) \qquad (8)$$

The absolute distance can thus be expressed as: $d = d' + d_0$ where d' is an arbitrary distance value and $d_0$ is the unknown initial offset. Eq. 8 yields a linear relationship between $P_{MB}^{-1/4}$ and d' following y=A+Bx, where $B = (4N\alpha\sigma_S R^2 \pi^2 f_M^2)^{-1/4}$ and $A = Bd_0$. The user can therefore vary the distance d' precisely using a stepper motor via the computing system 435. From several data points and using linear fit, the sheet conductivity can then be determined as further described herein.

Figure 7:
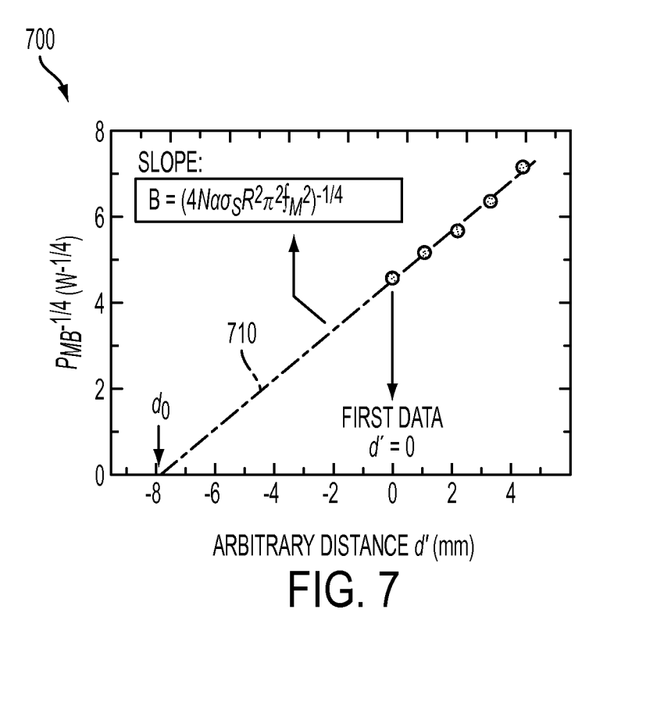
FIG. 7 illustrates a plot of $P_{MB}^{-1/4}$ versus d'.

Upon the insertion of the material under test at block 620, the motor 210 (260) will experience a braking torque. As such, at block 630, the user tunes the motor voltage $V_M$ to obtain the same $f_M$. The motor frequency can be set and measured implementing the motor controller 415 and frequency meter 430 as described herein. At block 635, the user then measures the on-load power as given in Eq. (5). The ammeter 421 and the voltmeter 422 are used for the measuring the respective values, $I_M$ and $V_M$. All measurements can be made and stored implementing the computing system 435 as described herein. At block 640, the user determines whether there are enough of the distance data points for Eq.8. If there are not enough data points, then at block 645, the user steps the distance: $d' \to \Delta d'$, and the method 600 continues at block 630. If there are enough data points at block 640, then at block 650, the user can generate a plot of $P_{MB}^{-1/4}$ versus d'. FIG. 7 illustrates a plot 700 of $P_{MB}^{-1/4}$ versus d', showing experimental data for the method 600. The slope 710 yields the sheet conductivity $\sigma_S$ and the x-axis intercept yield the distance offset $d_0$. At block 655, the user can then calculate $\sigma_S$ and $d_0$ from the plot 700 generated at block 650.

As described herein, the absolute distance can be expressed as: $d = d' + d_0$ where d' is an arbitrary distance value and $d_0$ is the unknown initial offset. Eq. 8 yields a linear relationship between $P_{MB}^{-1/4}$ and d' following y=A+Bx, where $B = (4N\alpha\sigma_S R^2 \pi^2 f_M^2)^{-1/4}$ and $A = Bd_0$. The user can vary the distance d' precisely using stepper motor. From several data points and using linear fit, the sheet conductivity can be determined as:

$$\sigma_S = [B^4 4N\alpha\pi^2 R^2 f_M^2]^{-1} \qquad (9)$$

Furthermore, the unknown offset $d_0$ is obtained:

$$d_0 = A/B \qquad (10)$$

In exemplary embodiments, the method 600 can also be implemented for the distance ($d_0$) measurement, which can be useful in certain situations such as a configuration in which conductor is buried underneath an insulating layer at an unknown distance. In addition, testing can be accelerated by creating multiple identical rotating magnetic systems like such as in FIG. 5, but without a linear actuator, but rather positioned at different position d' so that the data in FIG. 7 can be obtained simultaneously.

As described herein, the examples above are applicable for very thin conductors where t<<d. The systems and methods described herein can also be applied for a more general case of thick conductor (t≥d). In the thick conductor case, it is possible to determine the conductivity $\sigma$, the thickness t and the working distance d separately.

For a thick conductor, the magnetic braking force for a magnetic dipole moving along a conductor is given as:

$$F_{MB} = -\frac{\alpha\sigma v}{3}\left(\frac{1}{d^3} - \frac{1}{(d+t)^3}\right) \qquad (11)$$

By implementing the Type A magnetic head the magnetic braking power is given as:

$$P_{MB} = \frac{4}{3} N\alpha\sigma R^2 \pi^2 f_M^2 \left(\frac{1}{d^3} - \frac{1}{(d+t)^3}\right) \qquad (12)$$

Figure 8:
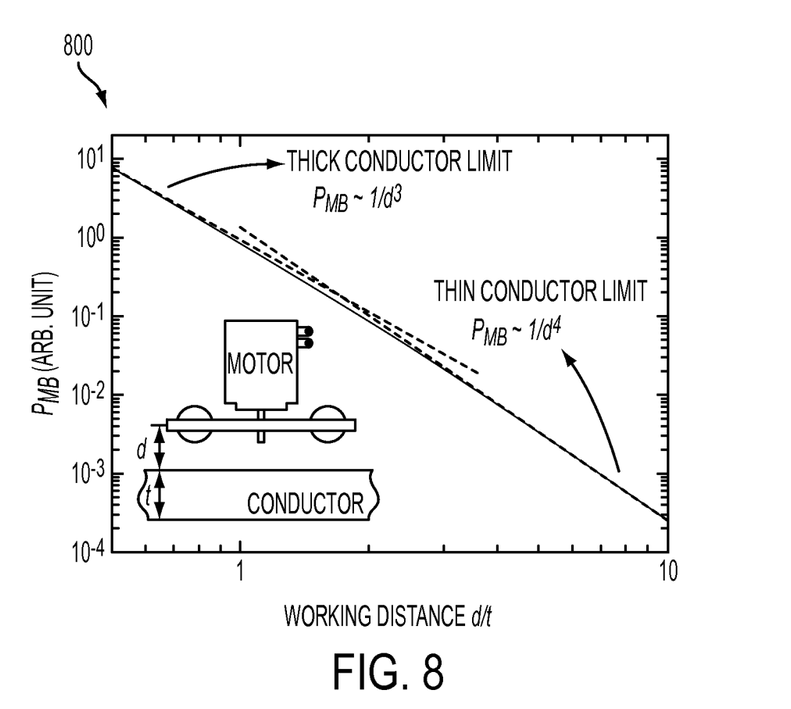
FIG. 8 illustrates a plot for a thick conductor metrology where the conductivity, the thickness of the conductor and the initial working distance can be determined separately.

The user can implement a method similar to the method 600 to obtain $P_{MB}$ VS. d data. FIG. 8 illustrates a plot 800 for a thick conductor metrology where the conductivity, the thickness of the conductor and the initial working distance can be determined separately. The user can then perform curve-fitting technique to fit the data into Eq. 12, and extract the conductivity $\sigma$ and thickness t separately. If the initial distance offset $d_0$ is not known, the user could use only the far distance data (i.e. "thin conductor limit" in FIG. 8) and apply the method 600 to determine $d_0$. Thus, for thick conductor case it is possible to determine $\sigma$, t and $d_0$ separately.

Figure 9:
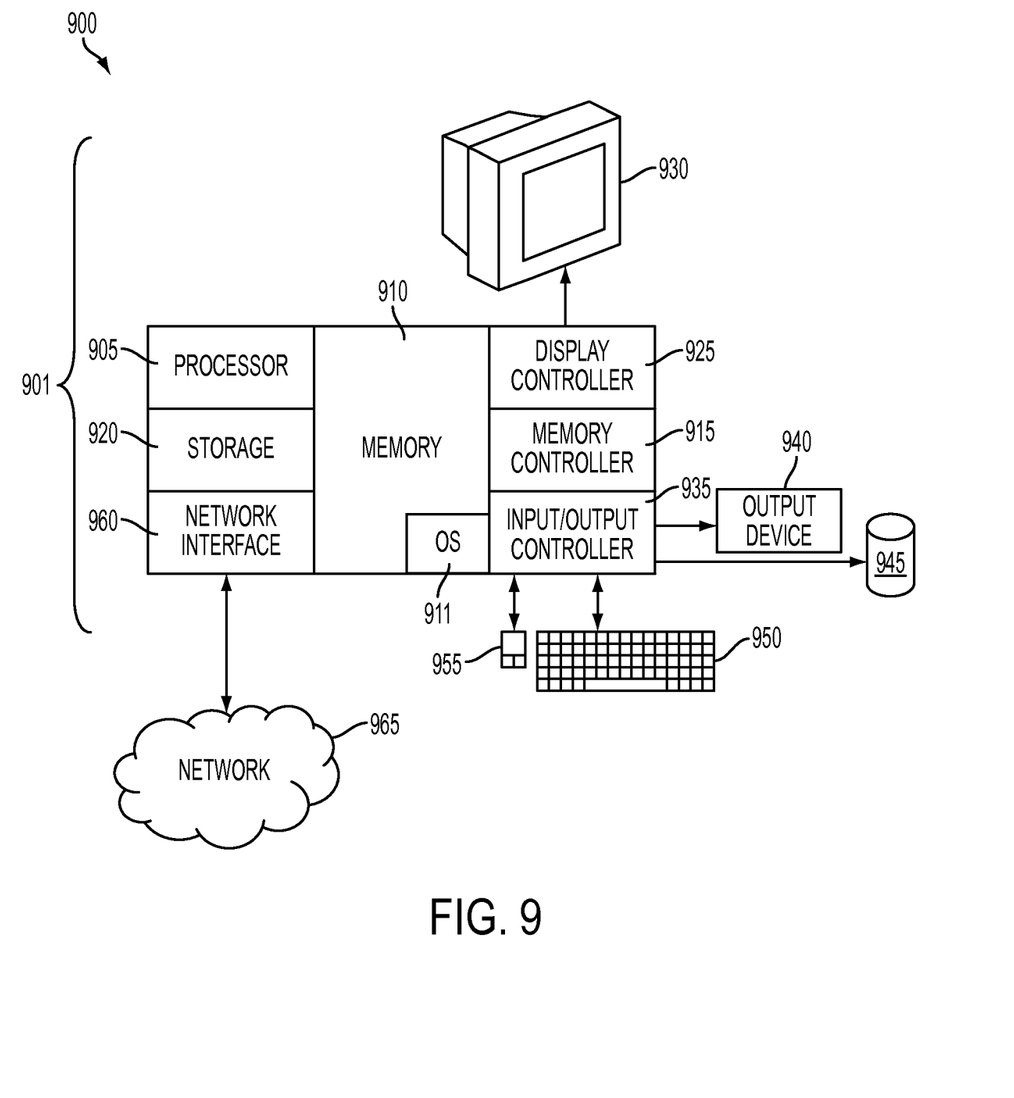
FIG. 9 illustrates an exemplary embodiment of a system that can be implemented for the non-contact sheet conductivity measurement system and methods described herein.

As described herein, any suitable computing system 435 can be implemented. FIG. 9 illustrates an exemplary embodiment of a system 100 that can be implemented for the non-contact sheet conductivity measurement system and methods described herein. The methods described herein can be implemented in software (e.g., firmware), hardware, or a combination thereof. In exemplary embodiments, the methods described herein are implemented in software, as an executable program, and is executed by a special or general-purpose digital computer, such as a personal computer, workstation, minicomputer, or mainframe computer. The system 900 therefore includes general-purpose computer 901.

In exemplary embodiments, in terms of hardware architecture, as shown in FIG. 9, the computer 901 includes a processor 905, memory 910 coupled to a memory controller 915, and one or more input and/or output (I/O) devices 940, 945 (or peripherals) that are communicatively coupled via a local input/output controller 935. The input/output controller 935 can be, but is not limited to, one or more buses or other wired or wireless connections, as is known in the art. The input/output controller 935 may have additional elements, which are omitted for simplicity, such as controllers, buffers (caches), drivers, repeaters, and receivers, to enable communications. Further, the local interface may include address, control, and/or data connections to enable appropriate communications among the aforementioned components.

The processor 905 is a hardware device for executing software, particularly that stored in memory 910. The processor 905 can be any custom made or commercially available processor, a central processing unit (CPU), an auxiliary processor among several processors associated with the computer 901, a semiconductor based microprocessor (in the form of a microchip or chip set), a macroprocessor, or generally any device for executing software instructions.

The memory 910 can include any one or combination of volatile memory elements (e.g., random access memory (RAM, such as DRAM, SRAM, SDRAM, etc.)) and nonvolatile memory elements (e.g., ROM, erasable programmable read only memory (EPROM), electronically erasable programmable read only memory (EEPROM), programmable read only memory (PROM), tape, compact disc read only memory (CD-ROM), disk, diskette, cartridge, cassette or the like, etc.). Moreover, the memory 910 may incorporate electronic, magnetic, optical, and/or other types of storage media. Note that the memory 910 can have a distributed architecture, where various components are situated remote from one another, but can be accessed by the processor 905.

The software in memory 910 may include one or more separate programs, each of which comprises an ordered listing of executable instructions for implementing logical functions. In the example of FIG. 9, the software in the memory 910 includes the non-contact sheet conductivity measurement methods described herein in accordance with exemplary embodiments and a suitable operating system (OS) 911. The OS 911 essentially controls the execution of other computer programs, such the non-contact sheet conductivity measurement systems and methods as described herein, and provides scheduling, input-output control, file and data management, memory management, and communication control and related services.

The non-contact sheet conductivity measurement methods described herein may be in the form of a source program, executable program (object code), script, or any other entity comprising a set of instructions to be performed. When a source program, then the program needs to be translated via a compiler, assembler, interpreter, or the like, which may or may not be included within the memory 910, so as to operate properly in connection with the OS 911. Furthermore, the non-contact sheet conductivity measurement methods can be written as an object oriented programming language, which has classes of data and methods, or a procedure programming language, which has routines, subroutines, and/or functions.

In exemplary embodiments, a conventional keyboard 950 and mouse 955 can be coupled to the input/output controller 935. Other output devices such as the I/O devices 940, 945 may include input devices, for example but not limited to a printer, a scanner, microphone, and the like. Finally, the I/O devices 940, 945 may further include devices that communicate both inputs and outputs, for instance but not limited to, a network interface card (NIC) or modulator/demodulator (for accessing other files, devices, systems, or a network), a radio frequency (RF) or other transceiver, a telephonic interface, a bridge, a router, and the like. The system 900 can further include a display controller 925 coupled to a display 930. In exemplary embodiments, the system 900 can further include a network interface 960 for coupling to a network 965. The network 965 can be an IP-based network for communication between the computer 901 and any external server, client and the like via a broadband connection. The network 965 transmits and receives data between the computer 901 and external systems. In exemplary embodiments, network 965 can be a managed IP network administered by a service provider. The network 965 may be implemented in a wireless fashion, e.g., using wireless protocols and technologies, such as WiFi, WiMax, etc. The network 965 can also be a packet-switched network such as a local area network, wide area network, metropolitan area network, Internet network, or other similar type of network environment. The network 965 may be a fixed wireless network, a wireless local area network (LAN), a wireless wide area network (WAN) a personal area network (PAN), a virtual private network (VPN), intranet or other suitable network system and includes equipment for receiving and transmitting signals.

If the computer 901 is a PC, workstation, intelligent device or the like, the software in the memory 910 may further include a basic input output system (BIOS) (omitted for simplicity). The BIOS is a set of essential software routines that initialize and test hardware at startup, start the OS 911, and support the transfer of data among the hardware devices. The BIOS is stored in ROM so that the BIOS can be executed when the computer 901 is activated.

When the computer 901 is in operation, the processor 905 is configured to execute software stored within the memory 910, to communicate data to and from the memory 910, and to generally control operations of the computer 901 pursuant to the software. The non-contact sheet conductivity measurement methods described herein and the OS 911, in whole or in part, but typically the latter, are read by the processor 905, perhaps buffered within the processor 905, and then executed.

When the systems and methods described herein are implemented in software, as is shown in FIG. 9, the methods can be stored on any computer readable medium, such as storage 920, for use by or in connection with any computer related system or method.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In exemplary embodiments, where the non-contact sheet conductivity measurement methods are implemented in hardware, the non-contact sheet conductivity measurement methods described herein can implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method for performing a non-contact resistivity measurement of a sheet of material to be measured, the method comprising:
    moving, with a motor, a magnet in one of a linear direction and a rotational direction;
    determining, with a power measuring device, a first power value used by the motor in moving the magnet when in proximity to the sheet of material, and measuring a second power value used by the motor in moving the magnet when not in proximity to the sheet of material; and
determining, with a computing device, a difference between the first power value and the second power value, wherein the first power value is greater than the second power value due to a magnetic braking effect from an induced eddy current in the sheet by motion of the magnet in proximity to the sheet of material, the computing device using the difference between the first and second power values to compute the resistivity of the sheet of material;
wherein the computing device uses a known distance between the magnet and the sheet of material to compute the resistivity of the sheet of material, and computes the resistivity, $\sigma_S$, of the sheet of material in accordance with the expression:

$$P_{MB} = \frac{4N\alpha\sigma_S R^2 \pi^2 f_m^2}{d^4}$$

with $\alpha = 3\mu_0^2 m^2/64\pi$
wherein $P_{MR}$ is a magnetic braking power dissipation value obtained from the difference between the first power value and the second power value, $f_m$ is a rotation frequency of the motor, N is the number of magnets, R is the distance the magnet or magnets are offset from a center of rotation of the disk, d is the distance between the magnet and the sheet of material, $\mu_0$ is magnetic permittivity of the sheet of material in a vacuum, and m is a magnetic moment of a magnetic dipole of the magnet.

2. The method of claim 1, wherein:
a disk is coupled to a shaft of the motor; and
the magnet comprises a first magnet embedded in the disk at a distance, R, that is offset from a center of rotation of the disk such that, when the motor is operating, rotation of the disk causes the first magnet to move in the linear direction.

3. The method of claim 2, wherein a second magnet is embedded in the disk opposite the first magnet, at the same distance, R, from the center of rotation of the disk as the first magnet.

4. The method of claim 3, wherein the first and second magnets are spherical magnets.

5. The method of claim 2, wherein the computing device computes the resistivity of the sheet of material without using a known distance between the magnet and the sheet of material by linearization of several $P_{MB}$ values determined from an initial arbitrary distance between the magnet and the sheet of material, and one or more additional distances of known variation from the initial arbitrary distance, wherein $P_{MB}$ is a magnetic braking power dissipation value obtained from the difference between the first power value and the second power value.

6. A method for performing a non-contact resistivity measurement of a sheet of material to be measured, the method comprising:
    moving, with a motor, a magnet in one of a linear direction and a rotational direction;
    determining, with a power measuring device, a first power value used by the motor in moving the magnet when in proximity to the sheet of material, and measuring a second power value used by the motor in moving the magnet when not in proximity to the sheet of material; and
    determining, with a computing device, a difference between the first power value and the second power value, wherein the first power value is greater than the second power value due to a magnetic braking effect from an induced eddy current in the sheet by motion of the magnet in proximity to the sheet of material, the computing device using the difference between the first and second power values to compute the resistivity of the sheet of material;
    wherein the computing device uses a known distance between the magnet and the sheet of material to compute the resistivity of the sheet of material, and computes the resistivity, $\sigma_S$, of the sheet of material in accordance with the expression:

$$P_{MB} = \frac{4\beta\sigma_S \pi^2 f_m^2}{d^2}$$

with $\beta = \mu_0^2 m^2/64\pi$
wherein $P_{MB}$ is a magnetic braking power dissipation value obtained from the difference between the first power value and the second power value, $f_m$ is a rotation frequency of the motor, d is the distance between the magnet and the sheet of material, $\mu_0$ is magnetic permittivity of the sheet of material in a vacuum, and m is a magnetic moment of a magnetic dipole of the magnet.

7. The method of claim 6, wherein:
a disk is coupled to a shaft of the motor; and
the magnet is embedded in the disk at a center of rotation of the disk such that, when the motor is operating, rotation of the disk causes the magnet to move in the rotational direction.

8. The method of claim 7, wherein the magnet is a spherical magnet.

9. The method of claim 7, wherein the computing device computes the resistivity of the sheet of material without using a known distance between the magnet and the sheet of material by linearization of several $P_{MB}$ values determined from an initial arbitrary distance between the magnet and the sheet of material, and one or more additional distances of known variation from the initial arbitrary distance, wherein $P_{MB}$ is a magnetic braking power dissipation value obtained from the difference between the first power value and the second power value.

* * * * *